United States Patent
Pettersson et al.

(10) Patent No.: US 10,437,223 B2
(45) Date of Patent: *Oct. 8, 2019

(54) MEASURING SYSTEM AND METHOD FOR AUTOMATED MEASUREMENT OF AN OBJECT

(71) Applicant: Hexagon Technology Center GmbH, Heerbrugg (CH)

(72) Inventors: Bo Pettersson, London (GB); Knut Siercks, Mörschwil (CH)

(73) Assignee: HEXAGON TECHNOLOGY CENTER GMBH, Heerbrugg (CH)

( * ) Notice: Subject to any disclaimer, the term of this patent is extended or adjusted under 35 U.S.C. 154(b) by 937 days.

This patent is subject to a terminal disclaimer.

(21) Appl. No.: 14/559,652

(22) Filed: Dec. 3, 2014

(65) Prior Publication Data

US 2015/0153720 A1  Jun. 4, 2015

(30) Foreign Application Priority Data

Dec. 4, 2013  (EP) .................................... 13195725

(51) Int. Cl.
*G05B 19/401* (2006.01)
*G01S 17/42* (2006.01)
(Continued)

(52) U.S. Cl.
CPC .......... *G05B 19/401* (2013.01); *G01B 21/04* (2013.01); *G01S 17/42* (2013.01); *G06F 17/50* (2013.01); *H04L 67/10* (2013.01); *Y02P 90/265* (2015.11)

(58) Field of Classification Search
None
See application file for complete search history.

(56) References Cited

U.S. PATENT DOCUMENTS 9,683,828 B2 *  6/2017  Pettersson .............. G01B 21/04
2005/0171733 A1  8/2005  Hough
(Continued)

FOREIGN PATENT DOCUMENTS

CN  103069252 A  4/2013
DE  101 30 737 B4  1/2003
(Continued)

OTHER PUBLICATIONS

European Search Report dated May 6, 2014 as received in Application No. EP 13 19 5725.

*Primary Examiner* — J. H. Hur
(74) *Attorney, Agent, or Firm* — Maschoff Brennan

(57) ABSTRACT

Some embodiments described herein relate to a measuring system for automated measurement of an object and detection of differences between features of the object and CAD data of the object. The measuring system may include a measuring device having a distance meter for measuring a position of at least one remote target point, a local computer terminal that is connected to or part of the measuring system, an assigned memory unit for storing the data base comprising the CAD data and an assigned set of measurement software program for controlling the measuring system. In some embodiments, the stored CAD data of the object comprise typical dimensions and tolerances of the features of the object and the assigned set of measurement software programs for controlling the measuring system comprises an optimization algorithm for the measurement of each feature.

28 Claims, 3 Drawing Sheets

(51) Int. Cl.
   *G06F 17/50* (2006.01)
   *H04L 29/08* (2006.01)
   *G01B 21/04* (2006.01)

(56) References Cited

U.S. PATENT DOCUMENTS

| | | | |
|---|---|---|---|
| 2012/0057174 A1* | 3/2012 | Briggs | G01C 15/002 356/603 |
| 2012/0236320 A1* | 9/2012 | Steffey | G01B 11/002 356/614 |
| 2012/0262550 A1† | 10/2012 | Bridges | |
| 2014/0046589 A1 | 2/2014 | Metzler et al. | |
| 2014/0198207 A1 | 7/2014 | Lippuner et al. | |

FOREIGN PATENT DOCUMENTS

| | | |
|---|---|---|
| DE | 102010014423 A1 | 10/2011 |
| EP | 1 330 686 B1 | 12/2006 |
| EP | 2 511 656 A1 | 10/2012 |
| WO | 2007/002319 A1 | 1/2007 |

\* cited by examiner
† cited by third party

MEASURING SYSTEM AND METHOD FOR AUTOMATED MEASUREMENT OF AN OBJECT

FIELD OF THE INVENTION

The present invention relates to a measuring system comprising a distance meter, particularly as part of a laser tracker, a theodolite or a laser scanner, and a method for automated measurement of an object and detection of differences between a feature of the object and computer-aided design (CAD) data of the object, the CAD data being stored in a data base. The measuring system comprises measurement functionality for determining three-dimensional coordinates of a feature of the object. The measuring system further comprises a local computer terminal that is connected to or part of the measuring system, an assigned memory unit for storing the data base comprising the CAD data, and an assigned set of measurement software programmes for controlling the measuring system.

BACKGROUND

Subsequent to the production of a large object it is common practice in quality assurance to inspect the object with a measuring system, such as a laser tracker system.

In a conventional laser-based measuring system, such as a laser tracker system, a probe target comprises measuring means, for example for tactile or optical measurements. Position determining means of the probe target are used by a laser-based measuring device, such as a laser tracker, to determine the position and attitude of the measuring target relative to the laser tracker and to determine the coordinates of a measurement point on an object being approached by the measuring means.

The functionality of a conventional laser tracker system is typically structured as follows:

The laser-based measuring system is designed to satisfy certain performance requirements, such as size, measurement accuracy and speed. The system dynamics is designed for allowing satisfaction of such requirements. A system controller is provided for running the system according to the required performance parameters, including system calibration for meeting an overall set of system specifications. Typically, a conventional laser tracker system is provided with a system software package comprising a basic software package and one or more additional feature software packages accomplishing the basic package.

A conventional process for measuring an object with a laser-based measuring system is structured as follows:

It is presupposed that CAD data of the object to be measured are available for preparation of the measurement. If this condition is satisfied, features of the object to be measured are selected. This regularly first implies choice of the way how the selected features shall be measured, and selection of a suitable measuring means. If there is a need for a datum then a way for realization of the datum is selected. Finally in the preparation phase, a part programme is selected, which may imply different degrees of automation, ranging from completely manual to fully automated generation of the part programme.

After accomplishment of the preparation phase, the execution phase of a conventional measurement process comprises the following steps:

Depending on required measurement accuracy and further required measurement and performance parameters, in the beginning a suitable laser-based measuring system is selected. Then typically the object to be measured is arranged at the laser-based measuring system, accompanied by the steps of calibrating the selected measuring means, setting up measuring system parameters, particularly also a targeted measurement accuracy and speed. The last steps of the execution phase comprise executing the measurement part programme and, finally, determining deviations between the CAD data and the measurement data of the real part.

The preparation of a laser-based measuring system for performing a measurement of an object takes a significant amount of time and efforts. Furthermore, precise measurements of features of objects of any kind require a variety of dedicated measurement tools or parts and availability of a large number of different measurement programmes.

DE 101 30 737 B4 discloses a system wherein a number of stations are used to measure and adjust cutting tools used on computer numerical control (CNC) machines. The units have measuring systems, controlled axes and are linked to local controllers that use local and remote software. The remote software is provided by a link over the internet to a central computer. The invention of DE 101 30 737 B4 is dedicated to solve the object of providing an adjustment device capable of performing a plurality of different measurement tasks in a flexible way and at low costs. For this purpose, according to DE 101 30 737 B4, a part of the system software is not resident on a local computer for device control, but on an external, central computer, thus reducing the requirements on the local control system. A user may be provided with remote software packages for measuring systems via the internet either for sale or for rent, or on any other basis, just only for the time when such "additional intelligence" is needed, this software being saved on and available from an external server.

Thus, system requirements to be realized on a user's site are reduced, but a support for improving the efficiency of working with the measuring system, particularly in the course of steps for preparation of a measurement, is not provided.

SUMMARY

Some embodiments described herein provide a control system that improves the performance of a laser-based measuring system, in particular to improve the efficiency of working with a laser-based measuring system and to reduce the work load for measurement preparation.

Some embodiments described herein include a measuring system for automated measurement of an object and/or a method for automated measurement of an object.

A measuring system according to the invention for automated measurement of an object and detection of differences between features of the object and CAD data of the object, the CAD data being stored in a data base, comprises a measuring device having a distance meter for measuring a position of at least one remote target point, a local computer terminal that is connected to or part of the measuring system, an assigned memory unit for storing the data base comprising the CAD data and an assigned set of measurement software programmes for controlling the measuring system. In one embodiment, the measuring system is characterized in that the stored CAD data of the object comprise typical dimensions and tolerances of the features of the object, and the assigned set of measurement software programmes for controlling the measuring system comprises an optimization algorithm for the measurement of each feature, the optimization algorithm being designed to select automatically, particularly dependent on the stored typical dimensions and tolerances of the features of the object to be measured, measuring parameters of the measuring system, and/or a measurement software programme from the set of measurement software programmes.

In another embodiment, the measuring system according to the invention comprises input means for a selection by a user of feature data comprising dimensions of a feature of the object and/or measurement data comprising a speed or tolerance level for the automated measurement, and the assigned set of measurement software programmes for controlling the measuring system comprises an optimization algorithm for the measurement of a feature, the optimization algorithm being designed to select automatically, particularly dependent on the selected feature data and/or measurement data, measuring parameters of the measuring system, and/or a measurement software programme from the set of measurement software programmes.

In one embodiment, the measuring device is adapted for measuring the position of the target point by determining a position and an orientation of a measuring auxiliary means, in particular wherein the measuring device is a laser tracker, the distance meter is a laser distance meter, and the measuring auxiliary means comprises a retro-reflector and an optically perceivable pattern, particularly comprising light spots.

In another embodiment, the distance meter is a laser distance meter, the measuring device comprising a geodetic measuring device, in particular a theodolite or a total-station, a laser scanner, and/or a laser tracker.

In a further embodiment, the assigned memory unit is provided at least partially at the site of the local computer terminal, in a private or public cloud and/or on a central computer of a network and/or an internet server and accessible over a local network connection and/or an internet connection, respectively, in particular wherein the local computer terminal is connected with the internet.

In one embodiment, the assigned set of measurement software programmes for controlling the measuring system is installed at least partially at the site of the local computer terminal, in a private or public cloud and/or on a central computer of a network and/or an internet server and accessible over a local network connection and/or an internet connection, respectively.

One embodiment of the measuring system additionally comprises a further set of features to be presented, effected by the optimization algorithm, to an operator after selection, by the operator, of a feature of the object to be measured, the further set comprising at least one of needed feature software packages, possible accuracy levels, an input option for the operator for selection of a requested accuracy level, and an input option for the operator for selection of a feature software package.

A method according to the invention for automated measurement of an object with a measuring system and for automated detection of deviations between a feature of the object and CAD data of the object, the CAD data being stored in a data base, the measuring system comprising a measuring device having a distance meter for measuring a position of at least one remote target point, a local computer terminal that is connected to or part of the measuring system, an assigned memory unit for storing the data base comprising the CAD data, and an assigned set of measurement software programmes for controlling the measuring system, the method comprising the steps of selecting a feature of the object to be measured by the measuring system, selecting measurement parameters of the measuring system, measuring the feature of the object, detecting deviations between the feature and the CAD data, and presenting deviations between the feature and the CAD data, is characterized in that the stored CAD data of the object comprises typical dimensions and tolerances of the features of the object, and, in the step of selecting measurement parameters of the measuring system, an optimization algorithm for the measurement of each feature automatically selects, particularly dependent on the stored typical dimensions and tolerances of the features of the object to be measured, measuring parameters of the measuring system, and/or a measurement software programme from a set of measurement software programmes.

A method according to the invention for automated measurement of an object with a measuring system, the measuring system comprising a measuring device having a distance meter for measuring a position of at least one remote target point, a local computer terminal that is connected to or part of the measuring system, input means for a selection by a user of feature data comprising dimensions of a feature of the object and/or measurement data comprising a speed or tolerance level for the automated measurement, and an assigned set of measurement software programmes for controlling the measuring system, the method comprising the steps of selecting a feature of the object to be measured by the measuring system, selecting measurement parameters of the measuring system, measuring the feature of the object, and presenting the result of measuring the feature, is characterized in that in the step of selecting measurement parameters of the measuring system, an optimization algorithm for the measurement of each feature automatically selects, particularly dependent on the selected feature data and/or measurement data, measuring parameters of the measuring system, and/or a measurement software programme from a set of measurement software programmes.

In one embodiment of the method, the measuring device is adapted for measuring the position of the target point by determining a position and an orientation of a measuring auxiliary means, in particular wherein the measuring device is a laser tracker, the distance meter is a laser distance meter, and the measuring auxiliary means comprises a retro-reflector and an optically perceivable pattern, particularly comprising light spots.

In another embodiment of the method, the distance meter is a laser distance meter, the measuring device comprising a geodetic measuring device, in particular a theodolite or a total-station, a laser scanner, and/or a laser tracker.

In a further embodiment of the method, features of the object having different sizes and tolerances are measured.

In a further embodiment of the method, the set of measurement software programmes comprises measurement software programmes for measuring features of different sizes and tolerances, which are automatically selected and executed in the course of performing a measurement.

In one embodiment, the assigned memory unit is installed at least partially at the site of the local computer terminal, in a private or public cloud and/or on a central computer of a network and/or an internet server and accessed over a local network connection and/or an internet connection, respectively.

In another embodiment, the assigned set of measurement software programmes for controlling the measuring system is installed at least partially at the site of the local computer terminal, and the method is executed at least partially on the local computer terminal, in a private or public cloud and/or on a central computer of a network and/or an internet server and accessed over a local network connection and/or an internet connection, respectively, and the method is executed at least partially in connection with the network and/or internet server.

In another embodiment of the method, after selection, by the operator, of a feature of the object to be measured, effected by the optimization algorithm, a set of features is presented to the operator, comprising at least one of needed feature software packages, and possible accuracy levels.

In another embodiment of the method, after selection, by the operator, of a feature of the object to be measured, effected by the optimization algorithm, a set of features is presented to the operator, comprising at least one of an input option for the operator for selection of a requested accuracy level, and an input option for the operator for selection of a feature software package.

In a further embodiment of the method, the automatic selection of the measurement software programme is subject to parameters of the measuring system, particularly the kind of laser-based distance measuring device, attributes of the feature of the object to be measured, and/or operator-selected parameters, in particular an accuracy or tolerance level, and/or a throughput or speed level of measurement to be executed.

A computer programme product according to the invention comprises programme code stored on a machine-readable medium for carrying out the method according to the invention.

A laser-based measuring system has measurement functionality for determining three-dimensional coordinates of a feature of an object. It comprises a laser distance meter, particularly as part of a laser tracker, a geodetic measuring device, such as a theodolite, or a laser scanner, and a measuring target comprising a measuring means, in particular tactile or optical measuring means, for approaching a measurement point of the object. The measuring target in particular also comprises position determining means for allowing determination of the position and attitude of the measuring target relative to the laser tracker and to determine the coordinates of the measurement point.

The laser-based measuring system further comprises a local computer terminal that is connected to or part of the measuring system, an assigned memory unit for storing the data base comprising the CAD data, and an assigned set of measurement software programmes for controlling the measuring system. The stored CAD data of the object comprise typical dimensions and tolerances of the features of the object. The assigned set of measurement software programmes for controlling the measuring system comprises an optimization algorithm for the measurement of each feature, the optimization algorithm being designed to automatically select, particularly dependent on the stored typical dimensions and tolerances of the features to be measured, measuring parameters of the measuring system, and/or a measurement software programme from the set of measurement software programmes.

Advantageously, the measurement preparation is thus largely facilitated for a user or operator. After selection of object features to be measured, the user does not need to spend further time and effort for finding the best way how to perform the measurement, because all necessary steps for measurement preparation are performed automatically.

According to a preferred embodiment of the invention, the local computer terminal is connected with the internet, particularly by a modem. Thus, data and software items for measuring system operation and measurement preparation and execution must not all be resident on the local computer, but can also be accessed via the internet.

According to one embodiment, the assigned memory unit is installed at least partially at the site of the local computer terminal. Thus, the assigned memory unit is accessible also in case of an interruption or breakdown of the internet connection.

According to another embodiment, the assigned memory unit is installed at least partially on a central computer of a network and/or an internet server and accessible over a local network connection and/or an internet connection, respectively. This reduces the requirements on the local data storage capacities and simultaneously enables access to a data base content that can easily be actualized with a high up-date frequency.

According to one embodiment, the assigned set of measurement software programmes for controlling the laser-based measuring system is installed at least partially at the site of the local computer terminal. This allows for locally operated control of the measuring system and measurement execution.

According to another embodiment, the assigned set of measurement software programmes for controlling the laser-based measuring system is installed at least partially on a central computer of a network and/or an internet server and accessible over a local network connection and/or an internet connection, respectively. This reduces the requirements on the local programme storage capacities, particularly in cases where large numbers of different measurement programmes for different kinds of measurements are needed, and simultaneously enables access to measurement programmes that can easily be actualized with a high up-date frequency.

According to a further embodiment of the invention, as an additional option, the system software for the laser-based measuring system additionally comprises a further set of features to be presented, effected by the optimization algorithm, to an operator after selection, by the operator, of a feature of the object to be measured. This further set may comprise
- needed feature software packages,
- possible accuracy levels,
- an input option for the operator for selection of a requested accuracy level, and
- an input option for the operator for selection of a feature software package.

The above list of optional features may be supplemented by further items. For example, additionally an estimated time for measuring with certain measurement accuracies and/or an estimated accuracy when measuring for a certain time may be presented to an operator. Furthermore, a price for buying or renting a certain software programme or a software package may be monitored.

This provides the operator with more flexibility for the choice of the definitive way how a measurement is executed, wherein, however, he is supported by the proposals provided by means of the optimization algorithm.

A further subject of the invention is a method for automated measurement of an object with a laser-based measuring system as described above and automated detection of deviations between a feature of the object and CAD data of the object, the CAD data being stored in a data base.

The method comprises the steps of selecting, by the operator, a feature of the object to be measured by the laser-based measuring system, selecting a probe system and measurement parameters of the measuring system, measuring the feature of the object, detecting deviations between the feature and the CAD data, and presenting deviations between the feature and the CAD data.

According to the invention, the stored CAD data of the object comprise typical dimensions and tolerances of the features of the object, and, in the step of selecting a probe system and measurement parameters of the laser-based measuring system, an optimization algorithm for the measurement of each feature automatically selects, particularly dependent on the stored typical dimensions and tolerances of the features of the object to be measured, measuring parameters of the laser-based measuring system, and/or a measurement software programme from a set of measurement software programmes.

Thereby, the automatic selection of the measurement software programme is subject to parameters of the laser-based measuring system, particularly its size, attributes of the feature to be measured, and/or operator-selected parameters, in particular an accuracy or tolerance level, and/or a throughput or speed level of measurement to be executed.

Preferably, the method is designed to enable measuring features having different sizes and tolerances. Thus, the method provides large measurement flexibility to an operator or user.

It is further preferred that the set of measurement software programmes comprises measurement software programmes for measuring features of different sizes and tolerances, which are automatically selected and executed in the course of performing a measurement.

As an example concerning a certain measurement task, this means that for measuring an object (e. g. an engine block), a first feature (e. g. four cylinders) is measured with a system/measurement accuracy "A" and measuring speed "B", a second feature (e. g. twenty cooling outlets) with an accuracy "C" and speed "D", and a third feature (e. g. eight thread holes) with an accuracy "E" and speed "F". Thereby, the system is preferably capable to switch automatically between different measurement modes, particularly concerning accuracy and measurement speed.

Thus, the user comfort for measuring system operation and measurement execution is enhanced, as the user does not need to spend time and effort for selecting system parameters and programme options dependent on feature sizes and tolerances.

Preferably, the local computer terminal is connected with the internet, particularly by a modem.

According to one embodiment of the inventive method, the assigned memory unit is installed at least partially at the site of the local computer terminal.

According to another embodiment, the assigned memory unit is installed at least partially on a central computer of a network and/or an internet server and accessed over a local network connection and/or an internet connection, respectively.

According to one embodiment, the assigned set of measurement software programmes for controlling the laser-based measuring system is installed at least partially at the site of the local computer terminal, and the method is executed at least partially on the local computer.

According to another embodiment, the assigned set of measurement software programmes for controlling the laser-based measuring system is installed at least partially on a central computer of a network and/or an internet server and accessed over a local network connection and/or an internet connection, respectively, and the method is executed at least partially in connection with the network and/or internet server.

According to a further embodiment of the inventive method, after selection, by the operator, of a feature of the object to be measured, effected by the optimization algorithm a set of features is presented to the operator, comprising at least one of needed feature software packages and possible accuracy levels.

The above list of optional feature items to be displayed may be supplemented by further items.

For example, additionally an estimated time for measuring with certain measurement accuracies and/or an estimated accuracy when measuring for a certain time may be presented to an operator. Furthermore, a price for buying or renting a certain software programme or a software package may be monitored. This broadens the information basis for a user in advance of a measurement.

Especially in combination with the last mentioned embodiment, it is preferred that, after selection, by the operator, of a feature to be measured, effected by the optimization algorithm a set of features is presented to the operator, comprising at least one of an input option for the operator for selection of a requested accuracy level, and an input option for the operator for selection of a feature software package.

This provides the operator with more flexibility for the choice of the definitive way how a measurement is executed, wherein the operator is supported by the proposals provided by means of the optimization algorithm.

BRIEF DESCRIPTION OF THE DRAWINGS

In the following, the invention will be described in detail by referring to exemplary embodiments that are accompanied by figures, in which.

DETAILED DESCRIPTION

Figure 1:
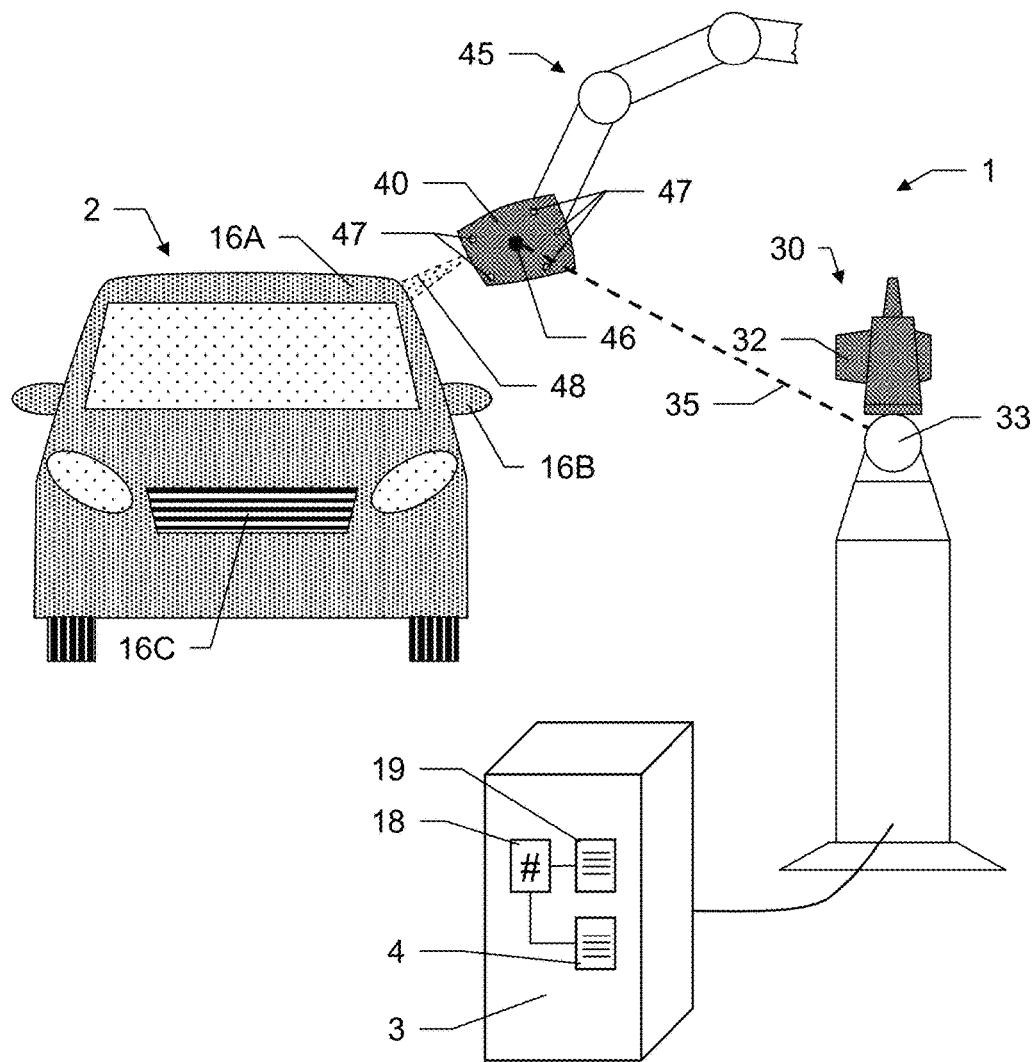
FIG. 1 shows a laser tracking system as an example of a measuring system according to the invention.

In FIG. 1, as an exemplary embodiment of a measuring system 1 according to the invention, a laser tracker system comprising a laser tracker 30 is depicted. The measuring system 1 also comprises a probe target 40, which in this example is mounted to a robotic arm 45 and adapted to measure features 16A, 16B, 16C of a target 2 contactless by means of scanning. The probe target 40 comprises a retro-reflector 46 and an optically perceivable pattern of spots 47. In this example, the object 2 to be measured is a newly produced car and the features 16A, 16B, 16C are roof, outside mirror, and radiator grill of this car, each of which having different production tolerances.

The laser tracker 30 comprises a camera unit 32 and a beam guidance unit 33. Though in this example the camera unit 32 and the beam guidance unit 33 are separate from each other, it must be understood that they could as well be combined in a common telescope unit.

The beam guidance unit 33 is adapted for emitting a measuring laser beam 35. In the depicted arrangement the laser beam 35 is aimed at the retro-reflector 46 of the probe target 40 and is retro-reflected by the retro-reflector 46 to the laser tracker 30. By means of this measuring laser beam 35 a distance to the retro-reflector 36 can be detected, in particular by means of time-of-flight measuring, phase measuring or according to the Fizeau principle. The laser tracker 30 comprises a precise distance meter for detecting the distance between the tracker 30 and the retro-reflector 46, as well as angular encoders for detecting a position of the beam guidance unit 33, by means of which a defined alignment and guidance of the laser beam 35 is achievable, so that a propagation direction of the laser beam 35 is detectable.

The camera unit 32 comprises image detection means for determining an orientation of lights on a sensor or in a detected image. Particularly the image detection means comprise a CMOS or are designed as a CCD camera or pixel sensor array camera. These sensors allow a position sensitive detection of a detected lighting on the sensor.

The probe target 40 comprises scanning means for emitting a scanning beam 48 towards the surface of an object 2 to be measured. Alternatively, the probe target 40 can comprise a tactile sensor having a contact point that can be brought in contact with the object 2 to be measured. During the scanning procedure (or during the contact) a spatial position of the probe target 40 and, thus, coordinates of at least a point of the feature of the object 2 are precisely determinable.

This determination is based on a defined relative position of the scanning means (or the contact point) to the retro-reflector 46 and to the spots 47 of the optically perceivable pattern. These spots can for instance be light emitting diodes (LED) or, alternatively, be designed in such a way that when illuminated they reflect light of a specific wavelength, or in such a way that they show a defined pattern and/or colour. From the position or distribution of the spots 47 in an image that is detected with a sensor of the image detection means, thus an orientation of the probe target 40 can be determined.

Both, the camera unit 32 and the beam guidance unit 33 are arranged pivotably about two axes, so that they can be aligned in such a way that by means of the camera unit 32 the probe target 40 the laser beam 35 is aimed at and the pattern of light spots 47 are perceivable. Thus, a precise distance to the retro-reflector 46 and—by means of the spatial distribution of the light spots 46—an orientation of the probe target 40 are detectable.

For aiming the laser beam 35 to the retro-reflector 46 the laser tracker 30 advantageously comprises illumination means for illuminating the retro-reflector 46 with light of a certain wavelength, particularly infrared, and at least two cameras having position-sensitive detectors.

The light, being reflected by the retro-reflector 46 and returned to the laser tracker 30, is detectable by the cameras. With each of the position-sensitive detectors a position of the retro-reflector 46 can be imaged on the respective detector. Thus, with the laser tracker 30 at least two imaged positions of the retro-reflector 46 can be determined and, depending on the imaged positions, the retro-reflector can be found—e.g. according to known principles of photogrammetry—and the beam guidance unit 33 can be aligned so that the laser beam 35 is aimed at the retro-reflector 46. Based on two images of the laser tracker 30 a rough position of the retro-reflector 46 is detectable. This position is determinable according to general geometric or trigonometric principles, e.g. geometric construction principles of triangles or by sine and/or cosine laws.

Also shown in FIG. 1 is a local computer terminal 3, as a control and calculation unit, which is, according to this example, designed to actuate motor drives of the robotic arm 45 of the laser-based measuring system 1 so that the probe target 40 travels to a measurement point of a feature 16 of the object 2. For manual operation, the control unit 3 may be connected to a user console. The control unit 3 may also be designed to effect fully automatic approach of the probe target 40 to the object 2 and measurement of features of the object 2.

The control and calculation unit 3 comprises a processor 18 and a plurality of memories 4, 19. In particular, the control and calculation unit 3 is designed for determining three space-coordinates of measurement points on a feature of the object 2.

According to one embodiment of the invention, a memory unit assigned to the laser-based measuring system 1 is installed at the site of the local computer terminal 3, for example as part of the memories 4, 19. In the memory unit may be stored a data base comprising CAD data of objects 2 to be measured, including sizes, typical dimensions and tolerances of features of an object 2, as well as measuring parameters of the measuring system 1.

According to a further embodiment of the invention, an assigned set of measurement software programmes for controlling the laser-based measuring system 1 is installed at the site of the local computer terminal 3, for example on a local hard disk. The assigned set of measurement software programmes comprises an optimization algorithm which is designed to automatically select, dependent on the stored typical dimensions and tolerances of the features to be measured, measuring parameters of the measuring system 1 and/or a measurement software programme from the set of measurement software programmes.

In one embodiment, the measuring system comprises input means (not shown) adapted for allowing a user to select by feature data comprising dimensions of a feature of the object and other measurement data, for instance a speed or tolerance level for the automated measurement.

Because the design of laser-based measuring systems of the generic kind as well as the design of different measuring instruments are well known to skilled persons, it must be understood that numerous modifications and combinations of different features can be made. All of these modifications lie within the scope of the invention.

Figure 2:
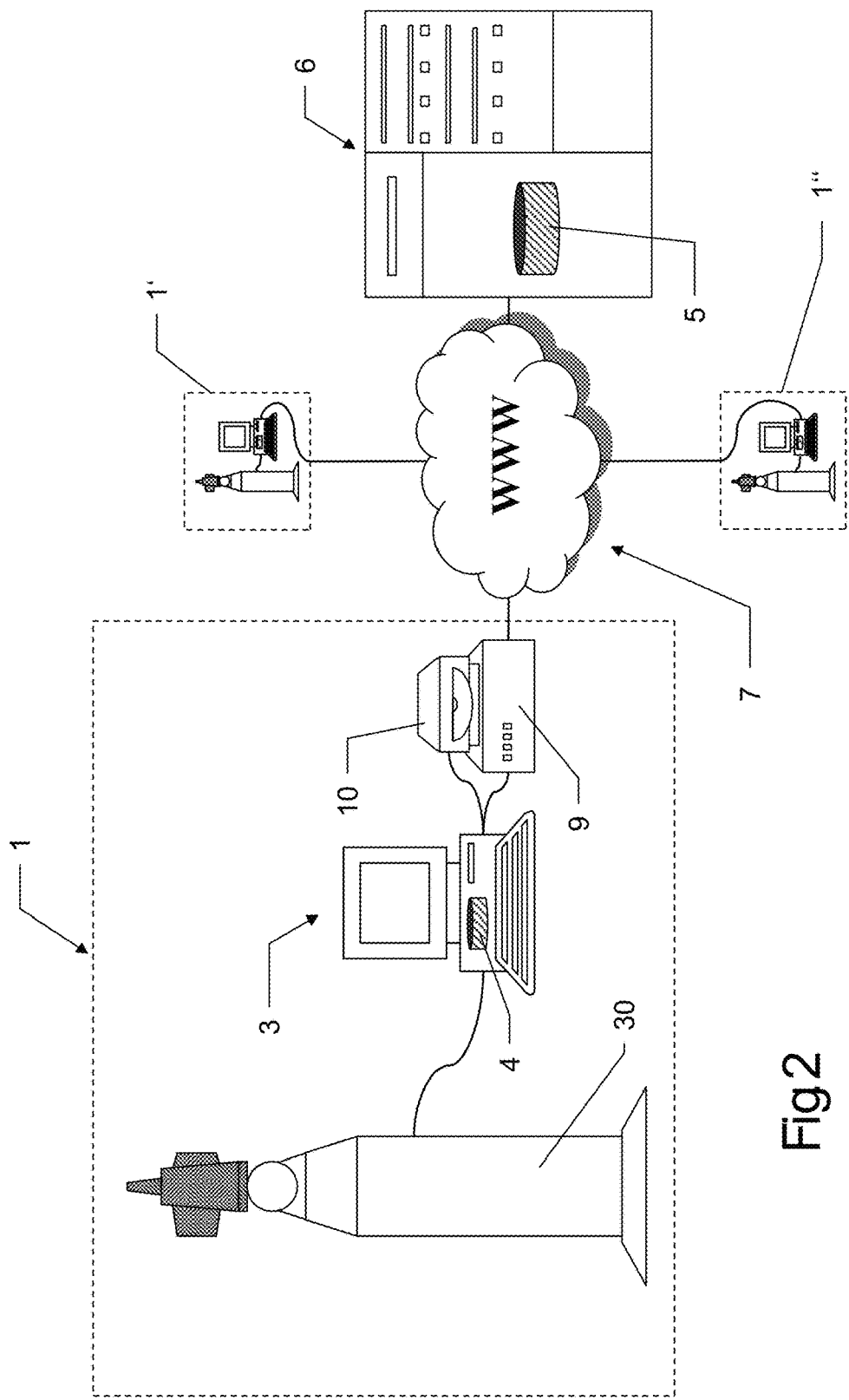
FIG. 2 shows an illustration of possible embodiments of the control structure for the measuring system of FIG. 1, from a local computer terminal and/or from external central computers.

The various embodiments of the control structure for the laser-based measuring system 1, from the local computer terminal 3 or from external central computers, are further illustrated in FIG. 2.

FIG. 2 shows, in a simplified form, a laser-based measuring system 1 largely similar to the one of FIG. 1 with a laser tracker 30 and a local computer terminal 3 that is connected to the laser tracker 30. The local computer terminal 3, as a control and calculation unit 3, comprises a processor and a memory 4. In particular, the control and calculation unit 3 is designed for determining three-space coordinates of measurement points of a feature of an object to be measured by the measuring system 1. The local computer terminal 3 is provided with a disk drive or additional memory 10, which is arranged externally in this embodiment, and connected to the internet 7 by means of a modem 9.

A central computer or server 6, comprising memory 5, is connected to the internet 7.

According to one embodiment of the invention, the memory unit assigned to the laser-based measuring system 1 is installed on the central computer 6 of a network and/or internet server and made accessible to the local computer terminal 3 over a local network connection and/or the internet connection (modem) 9.

According to a further embodiment, the set of measurement software programmes for controlling the laser-based measuring system 1 and assigned to the measuring system 1 is installed on the central computer 6 of a network and/or internet server and made accessible to the local computer terminal 3 over a local network connection and/or the internet connection 9.

According to the shown example, the set of measurement software programmes is additionally made available to further laser-based measuring systems 1', 1" via the internet 7.

The memory unit and the set of measurement software programmes may be completely or partially be stored and executed on the local computer terminal 3 or the central computer 6.

Figure 3:
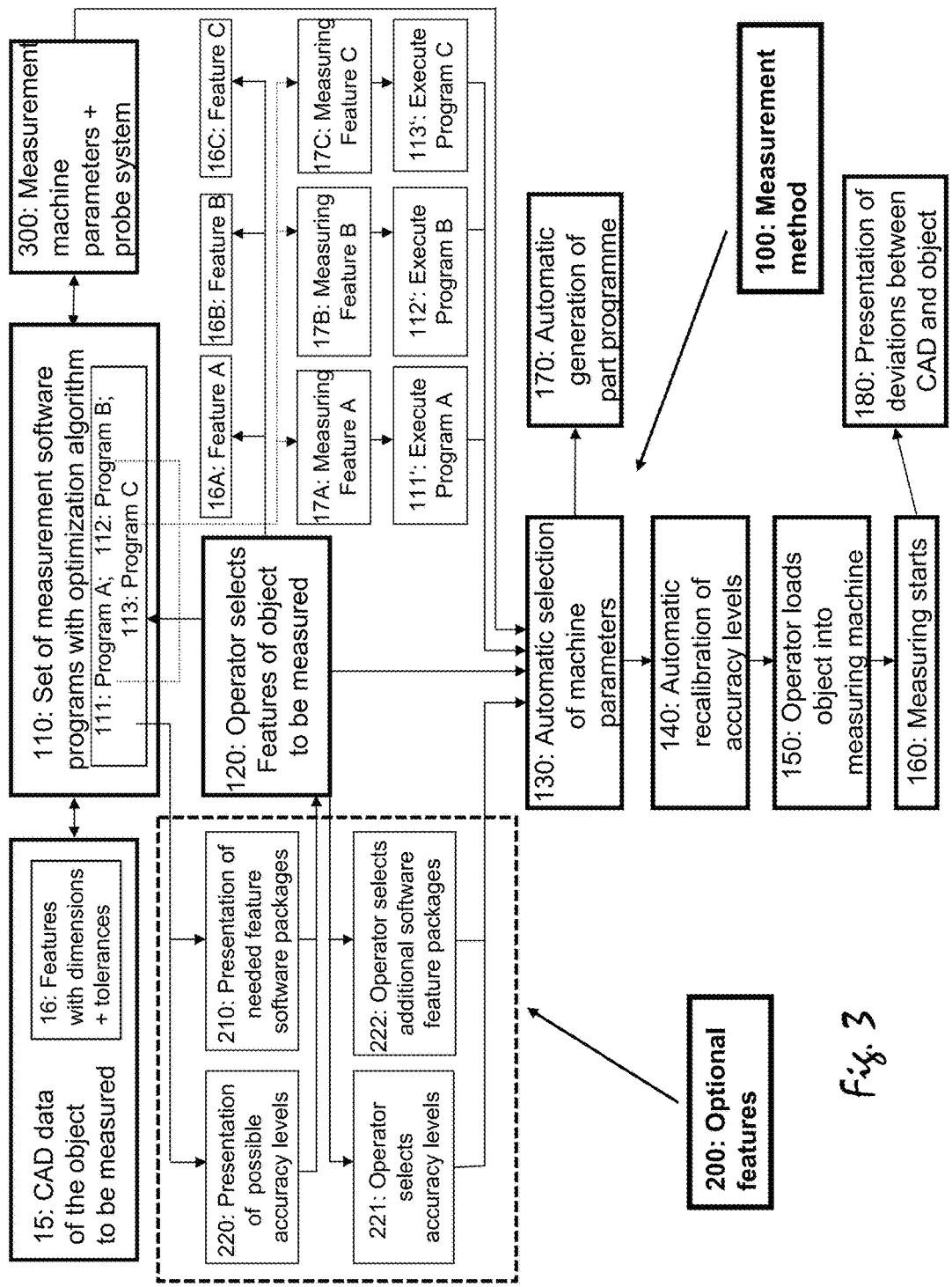
FIG. 3 shows an illustration of the method according to the invention for automated measurement of an object with a measuring system as illustrated in FIG. 1 and FIG. 2.

FIG. 3 illustrates the method according to the invention for automated measurement of an object with a laser-based measuring system, particularly a coordinate measuring system, as described with reference to FIG. 1 and FIG. 2.

It is presupposed that CAD data 15 of the object to be measured are available and comprise typical dimensions, sizes and tolerances of one or more features 16. These data are typically stored in a data base as a part of a memory unit assigned to the laser-based measuring system and stored at the site of local computer as a control and evaluation unit of the measuring system or on a central computer of a network and/or an internet server, which is accessible from the local computer terminal over a local network connection and/or an interconnection, respectively.

In a further data base, also located (at least partially) locally or (at least partially) externally or both, are stored probe systems and measuring system parameters 300.

As a further prerequisite for execution of the method according to the invention, a set 110 of measurement software programmes, comprising an optimization algorithm, is provided, the set 110 comprising, for example, a programme (A) 111 dedicated for a feature 16A, a programme (B) 122 dedicated for a feature 16B, and a programme (C) 113 dedicated for a feature 16C.

Under the assumption that the above preconditions are satisfied, an operator selects, in a step 120, features of the object to be measured, for example features 16A, 16B, and 16C. This selection is transferred to the set 110 of measurement software programmes, and the optimization algorithm automatically selects, in a step 130, for each feature 16A, 16B, 16C chosen by the operator, measuring parameters 17A, 17B, 17C of the laser-based measuring system 1, and/or a related measurement programme 111, 112,113 from the set 110 of measurement software programmes, to be executed in steps 111', 112', and/or 113', respectively. Thereby, the automatic selection particularly depends on the stored typical dimensions and tolerances of the selected features 16A, 16B, and 16C. This is accompanied by a selection of a suitable probe system—for instance a touch probe or a contactless probe (as shown in FIG. 1).

Form tolerances will automatically lead to the selection of a certain scanning mode. Then, dependent on tolerance demands, adequate probe and accuracy files are automatically selected. Position tolerances can be measured in different ways, and a selection will depend on other selections.

The probe system is selected automatically depending on certain aspects, such as the needed accuracy, the throughput, the availability, etc. The system will automatically find out if there is a need for a datum and then select how to create it.

Step 130 is followed typically, in a step 140, by an automatic recalibration of the system accuracy levels required for the measurements of the selected features. The method step 130 also triggers an automatic generation of part programmes, in a step 170. This accomplishes the preparation phase of the measurement.

Then, in a step 150, the object to be measured is brought to the measuring system and, if necessary, a selected probe system is installed. Then, in a step 160, the measurement is started.

After accomplishment of the measurement, the measured object data, as real part measurement data, are compared with the CAD data 15, and deviations between the measured real data and the CAD data 15 are determined and presented.

The above sequence of method steps represents a first embodiment of the measurement method according to the invention.

The embodiment of the invention as illustrated in the figures and described above implies, concerning the automatic selection of a measurement software programme, that, if a programme or function is not locally available, but the programme being required for an optimum precise measurement, the system will automatically try to find the related programme or features on the web/computer/intranet and load it into the active computer memory for availability for execution.

This means that in the course of a measuring task for measuring an object (e. g. an engine block) a first feature (e. g. four cylinders) is measured with system accuracy "A" and measuring speed "B", a second feature (e. g. twenty cooling outlets) with accuracy "C" and speed "D", and a third feature (e. g. eight thread holes) with accuracy "E" and speed "F".

Preferably, during the execution of the measuring programme the system is able to automatically switch between the different modes.

A further embodiment comprises a set 200 of optional features and/or additional steps insertable into, or more precisely parallel to, the flow of steps as described above, before the step 130.

According to this second embodiment of the inventive method, after the input of the feature selection by the operator to the set 110 of measurement software programmes, the optimization algorithm automatically selects and effects presentation to the operator of one more of:

210: needed feature software packages;
220: possible accuracy levels.

The operator may then select:

221: accuracy levels; and/or
222: additional software feature packages.

It should be noted that the above list of options may be supplemented by further items.

Additionally, an estimated time for measuring with certain measurement accuracies and/or an estimated accuracy when measuring for a certain time may be presented to an operator. Furthermore, a price for buying or renting a certain software programme 111, 112, 113 or a software package may be monitored. If the software is stored locally, e. g. there may be an enabling key for each programme or module, and if the software is hosted on a remote server, the "enabler" for the operator may be a business card.

After input reply in response to such a presentation of a set 200 of additional options by the operator to the set 110 of measurement software programmes, the optimization algorithm automatically then selects, in a step 130, for each feature 16A, 16B, 16C chosen by the operator, measuring parameters 17A, 17B, 17C of the measuring system 1, and/or a related measurement programme 111, 112, 113 from the set 110 of measurement software programmes, thereby taking into account the feedback of the operator. The further sequence of method steps is then the same as described for the first embodiment of the inventive method.

Although the invention is illustrated above, partly with reference to some preferred embodiments, it has to be understood that numerous modifications and combinations of different features of the embodiments can be made. Particularly, all described embodiments can be combined if not explicitly stated otherwise. All of these modifications lie within the scope of the appended claims.

What is claimed is:

1. A measuring system for automated measurement of an object and detection of differences between features of the object and CAD data of the object, the CAD data being stored in a database, the measuring system comprising:
    a measuring device having a distance meter for measuring a position of at least one remote target point;
    a local computer terminal that is connected to or part of the measuring system;
    an assigned memory unit for storing the database comprising the CAD data, wherein the assigned memory unit is provided at least partially at the site of the local computer terminal; and
    an assigned set of measurement software programs for controlling the measuring system,
    wherein the stored CAD data of the object comprise dimensions and tolerances of the features of the object;
    wherein the assigned set of measurement software programs for controlling the measuring system comprises an optimization algorithm for the measurement of each feature, the optimization algorithm being designed to select automatically, dependent on the stored dimensions and tolerances of the features of the object to be measured, measuring parameters of the measuring system and a measurement software program from the set of measurement software programs;
    wherein the assigned set of measurement software programs for controlling the measuring system is installed at least partially in a central computer of a local network or an internet server and accessible from the local computer terminal over a local network connection and/or an internet connection; and
    wherein the optimization algorithm is adapted to effect, after selection of a feature of the object to be measured by an operator, a presentation of a set of options to the operator for selection, the set comprising:
    possible accuracy levels for the measurement of the feature,
    an input option for the operator for selection of an accuracy level,
    needed software packages comprising additional measurement software programs for measuring the feature with the selected accuracy level, the needed software packages being installed on the central computer, and
    an input option for the operator for selection of a needed software package to be accessed over the local network or internet connection.

2. The measuring system according to claim 1, wherein the measuring device is adapted for measuring the position of the target point by determining a position and an orientation of a measuring auxiliary means, wherein:
    the measuring device is a laser tracker,
    the distance meter is a laser distance meter, and
    the measuring auxiliary means comprises a retro-reflector and an optically perceivable pattern comprising light spots.

3. The measuring system according to claim 1, wherein the distance meter is a laser distance meter, and the measuring device comprises at least one of a theodolite or a total-station, a laser scanner, and a laser tracker.

4. The measuring system according to claim 1, wherein the assigned memory unit is provided at least partially:
    on the central computer of the local network and/or the internet server and accessible over the local network connection and/or the internet connection, respectively, wherein the local computer terminal is connected with the internet.

5. The measuring system according to claim 1, wherein the further set of features to be presented comprises at least an estimated time for measuring with a certain measurement accuracy.

6. A measuring system for automated measurement of an object, the measuring system comprising:
    a measuring device having a distance meter for measuring a position of at least one remote target point;
    a local computer terminal that is connected to or part of the measuring system; and
    an assigned set of measurement software programs for controlling the measuring system,
    wherein the assigned set of measurement software programs for controlling the measuring system comprises an optimization algorithm for the measurement of a feature, the optimization algorithm being designed to select automatically, dependent on feature data and/or measurement data selected by a user, measuring parameters of the measuring system, and/or a measurement software program from the set of measurement software programs, wherein the feature data comprises dimensions of a feature of the object and the measurement data comprises a speed or tolerance level for the automated measurement;
    wherein the assigned set of measurement software programs for controlling the measuring system is installed at least partially in a central computer of a local network or an internet server and accessible from the local computer terminal over a local network connection and/or an internet connection; and
    wherein after selection of a feature of the object to be measured, effected by the optimization algorithm a set of options is presented to an operator, the set comprising:
    possible accuracy levels for measurement of the feature,
    an input option for the operator for selection of an accuracy level,
    needed software packages for measuring the feature with the selected accuracy level, the needed software packages being installed on the central computer, and
    an input option for the operator for selection of a needed software package,
    wherein a selected software package is accessed over the local network or internet connection.

7. The measuring system according to claim 6, wherein the measuring device is adapted for measuring the position of the target point by determining a position and an orientation of a measuring auxiliary means, wherein:
    the measuring device is a laser tracker,
    the distance meter is a laser distance meter, and
    the measuring auxiliary means comprises a retro-reflector and an optically perceivable pattern comprising light spots.

8. The measuring system according to claim 6, wherein the distance meter is a laser distance meter, and the measuring device comprises at least one of a theodolite or a total-station, a laser scanner, and a laser tracker.

9. The measuring system according to claim 6, wherein an assigned memory unit is provided at least partially:
on the central computer of the local network and/or the internet server and accessible over the local network connection and/or the internet connection, respectively, wherein the local computer terminal is connected with the internet.

10. The measuring system according to claim 6, wherein the assigned set of measurement software programs for controlling the measuring system is installed at least partially at the site of the local computer terminal.

11. The measuring system according to claim 6, wherein the further set of features to be presented comprises at least an estimated time for measuring with a certain measurement accuracy.

12. A method for automated measurement of an object with a measuring system and for automated detection of deviations between a feature of the object and CAD data of the object, the CAD data being stored in a database, the measuring system comprising
a measuring device having a distance meter for measuring a position of at least one remote target point;
a local computer terminal that is connected to or part of the measuring system;
an assigned memory unit for storing the database comprising the CAD data, wherein the assigned memory unit is installed at least partially at the site of the local computer terminal; and
an assigned set of measurement software programs for controlling the measuring system,
the method comprising:
selecting a feature of the object to be measured by the measuring system;
selecting measurement parameters of the measuring system;
measuring the feature of the object;
detecting deviations between the feature and the CAD data; and
presenting deviations between the feature and the CAD data;
wherein the stored CAD data of the object comprises dimensions and tolerances of the features of the object; and
wherein selecting measurement parameters of the measuring system comprises automatically selecting, by an optimization algorithm, for the measurement of each feature, dependent on the stored dimensions and tolerances of the features of the object to be measured, measuring parameters of the measuring system, and/or a measurement software program from a set of measurement software programs,
wherein the assigned set of measurement software programs for controlling the measuring system is installed at least partially on a central computer of a local network or an internet server and accessed over a local network connection and/or an internet connection, and the method is executed at least partially in connection with the local network or the internet server; and
wherein the optimization algorithm is adapted to effect, after selection of a feature of the object to be measured by an operator, a presentation of a set of options for the operator, the set comprising:
possible accuracy levels for the measurement of the feature,
an input option for the operator for selection of an accuracy level,
needed software packages comprising additional measurement software programs for measuring the feature with the selected accuracy level, the needed software packages being installed on the central computer, and
an input option for the operator for selection of a needed software package to be accessed over the local network or internet connection.

13. The method according to claim 12, wherein:
the measuring device is adapted for measuring the position of the target point by determining a position and an orientation of a measuring auxiliary means;
the measuring device is a laser tracker,
the distance meter is a laser distance meter, and
the measuring auxiliary means comprises a retro-reflector and an optically perceivable pattern comprising light spots.

14. The method according to claim 12, wherein
the distance meter is a laser distance meter, and
the measuring device comprises at least one of a theodolite or a total-station, a laser scanner, and a laser tracker.

15. The method according to claim 12, wherein:
features of the object having different sizes and tolerances are measured, and/or
the set of measurement software programs comprises measurement software programs for measuring features of different sizes and tolerances, which are automatically selected and executed in the course of performing a measurement.

16. The method according to claim 12, wherein the assigned memory unit is installed at least partially:
on the a central computer of the local network and/or the internet server and accessed over the local network connection and/or the internet connection, respectively.

17. The method according to claim 12, wherein:
the automatic selection of the measurement software program is subject to:
parameters of the measuring system, particularly the kind of laser-based distance measuring device,
attributes of the feature of the object to be measured, and/or
operator-selected parameters, in particular an accuracy or tolerance level, and/or a throughput or speed level of measurement to be executed.

18. One or more non-transitory computer-readable media storing one or more programs that are configured, when executed, to cause one or more processors to execute the method as recited in claim 12.

19. The method according to claim 12, wherein at least an estimated time for measuring with a certain measurement accuracy is presented to the operator.

20. A method for automated measurement of an object with a measuring system, the measuring system comprising:
a measuring device having a distance meter for measuring a position of at least one remote target point;
a local computer terminal that is connected to or part of the measuring system; and
an assigned set of measurement software programs for controlling the measuring system,
the method comprising:
selecting a feature of the object to be measured by the measuring system;
selecting measurement parameters of the measuring system;
measuring the feature of the object; and
presenting the result of measuring the feature;
wherein selecting measurement parameters of the measuring system comprises automatically selecting, by an optimization algorithm, for the measurement of each feature, dependent on feature data and/or measurement data selected by a user, measuring parameters of the measuring system, and/or a measurement software program from a set of measurement software programs, wherein the feature data comprises dimensions of a feature of the object and the measurement data comprises a speed or tolerance level for the automated measurement;

wherein the assigned set of measurement software programs for controlling the measuring system is installed at least partially on a central computer of a local network or an internet server and accessed over a local network connection and/or an internet connection, and the method is executed at least partially in connection with the network or the internet server; and wherein the optimization algorithm is adapted to effect, after selection of a feature of the object to be measured by an operator, a presentation of a set of options for the operator, the set comprising:

possible accuracy levels for the measurement of the feature, an input option for the operator for selection of an accuracy level, needed software packages comprising additional measurement software programs for measuring the feature with the selected accuracy level, the needed software packages being installed on the central computer, and an input option for the operator for selection of a needed software package to be accessed over the local network or internet connection.

21. The method according to claim 20, wherein:
the measuring device is adapted for measuring the position of the target point by determining a position and an orientation of a measuring auxiliary means;
the measuring device is a laser tracker,
the distance meter is a laser distance meter, and
the measuring auxiliary means comprises a retro-reflector and an optically perceivable pattern comprising light spots.

22. The method according to claim 20, wherein
the distance meter is a laser distance meter, and
the measuring device comprises at least one of a theodolite or a total-station, a laser scanner, and a laser tracker.

23. The method according to claim 20, wherein:
features of the object having different sizes and tolerances are measured, and/or
the set of measurement software programs comprises measurement software programs for measuring features of different sizes and tolerances, which are automatically selected and executed in the course of performing a measurement.

24. The method according to claim 20, wherein an assigned memory unit is installed at least partially
on the central computer of the local network and/or the internet server and accessed over the local network connection and/or the internet connection, respectively.

25. The method according to claim 20, wherein the assigned set of measurement software programs for controlling the measuring system is installed at least partially at the site of the local computer terminal, and the method is executed at least partially on the local computer terminal.

26. The method according to claim 20, wherein the automatic selection of the measurement software program is subject to:
parameters of the measuring system, particularly the kind of laser-based distance measuring device,
attributes of the feature of the object to be measured, and/or
operator-selected parameters, in particular an accuracy or tolerance level, and/or a throughput or speed level of measurement to be executed.

27. One or more non-transitory computer-readable media storing one or more programs that are configured, when executed, to cause one or more processors to execute the method as recited in claim 20.

28. The method according to claim 20, wherein at least an estimated time for measuring with a certain measurement accuracy is presented to the operator.

* * * * *